US006978828B1

(12) United States Patent
Gunawardana

(10) Patent No.: US 6,978,828 B1
(45) Date of Patent: Dec. 27, 2005

(54) HEAT PIPE COOLING SYSTEM

(75) Inventor: Ruvinda Gunawardana, Sugar Land, TX (US)

(73) Assignee: Schlumberger Technology Corporation, Sugar Land, TX (US)

(*) Notice: Subject to any disclaimer, the term of this patent is extended or adjusted under 35 U.S.C. 154(b) by 0 days.

(21) Appl. No.: 10/710,101

(22) Filed: Jun. 18, 2004

(51) Int. Cl.$^{7}$ .............................................. F28D 15/00
(52) U.S. Cl. .................................... 165/104.26; 165/45
(58) Field of Search ............................ 165/104.33, 41, 165/104.26, 185; 361/699, 700; 257/714–716

(56) References Cited

U.S. PATENT DOCUMENTS 2,350,348 A 6/1944 Gaugler
2,671,323 A 3/1954 Richert
2,711,084 A 6/1955 Bergan
3,038,074 A 6/1962 Scherbatskoy
4,133,376 A * 1/1979 Eilenberg et al. ...... 165/104.21
4,375,157 A 3/1983 Boesen
4,513,352 A 4/1985 Bennett et al.
4,517,459 A 5/1985 Richter, Jr. et al.
4,880,050 A * 11/1989 Nakamura et al. ............ 165/41
4,897,997 A 2/1990 Meijer et al.
5,699,982 A * 12/1997 Daugherty .................. 244/63
5,720,342 A 2/1998 Owens et al.
5,735,489 A * 4/1998 Drolen et al. ............... 244/163
5,806,803 A * 9/1998 Watts ......................... 244/163
5,823,477 A * 10/1998 York .......................... 244/163
5,931,000 A 8/1999 Turner et al.
6,052,285 A * 4/2000 Hileman ..................... 361/699
6,134,892 A 10/2000 Turner et al.
6,148,906 A * 11/2000 Li et al. ................ 165/104.33
6,216,804 B1 4/2001 Aumann et al.
6,336,408 B1 1/2002 Parrott et al.
6,341,498 B1 1/2002 DiFoggio
6,351,951 B1 3/2002 Guo et al.
6,378,631 B1 4/2002 Aumann et al.
6,394,175 B1 5/2002 Chen et al.
6,474,074 B2 11/2002 Ghoshal
6,595,269 B2 7/2003 Mitchell
6,639,797 B2 10/2003 Saeki et al.
6,659,204 B2 12/2003 Aumann et al.
6,717,811 B2 4/2004 Lo et al.
6,717,813 B1 4/2004 Garner et al.
6,741,468 B2 5/2004 Jing et al.
2003/0000683 A1 * 1/2003 Mast et al. ............ 165/104.26
2003/0056936 A1 * 3/2003 Lindemuth et al. ........... 165/45

(Continued)

FOREIGN PATENT DOCUMENTS

JP 58-198690 * 11/1983 .................. 165/41

(Continued)

*Primary Examiner*—Terrell McKinnon
(74) *Attorney, Agent, or Firm*—Victor H. Segura; Brigitte L. Echols

(57) ABSTRACT

Systems and techniques for cooling a component within a housing using a composition of heat pipes. The housing contains a first heat pipe having a condenser section and an evaporator section; a plurality of secondary heat pipes, each having condenser and an evaporator sections, disposed in parallel within the housing with the evaporator sections of the secondary pipes near the condenser section of the first heat pipe; wherein the plurality of secondary heat pipes are adapted to absorb heat rejected from the condenser section of the first heat pipe for distribution from the condenser sections of the secondary heat pipes. A cooling method entails disposing the primary and secondary heat pipes within the housing; adapting the secondary pipes to absorb heat rejected from the primary pipe; and distributing the heat absorbed by the secondary heat pipes toward an end of the housing.

23 Claims, 5 Drawing Sheets

U.S. PATENT DOCUMENTS

| | | | | |
|---|---|---|---|---|
| 2003/0136548 | A1 | 7/2003 | Parish et al. | |
| 2003/0161102 | A1 | 8/2003 | Lee et al. | |
| 2003/0196787 | A1 | 10/2003 | Mahoney | |
| 2003/0230398 | A1 | 12/2003 | Lee et al. | |
| 2004/0042169 | A1 | 3/2004 | Artman et al. | |
| 2004/0050534 | A1 | 3/2004 | Malone et al. | |
| 2004/0052052 | A1 | 3/2004 | Rivera | |
| 2004/0056541 | A1 | 3/2004 | Steinmeyer | |
| 2004/0057205 | A1 | 3/2004 | Chen et al. | |
| 2004/0069461 | A1 | 4/2004 | Yuyama et al. | |
| 2004/0070933 | A1 | 4/2004 | Sarraf et al. | |
| 2004/0070942 | A1 * | 4/2004 | Tomioka et al. | 361/700 |
| 2004/0074633 | A1 | 4/2004 | Liu | |
| 2004/0085733 | A1 | 5/2004 | Leon et al. | |
| 2004/0089012 | A1 | 5/2004 | Chen et al. | |
| 2004/0099407 | A1 | 5/2004 | Parish, IV et al. | |

FOREIGN PATENT DOCUMENTS

| | | | |
|---|---|---|---|
| JP | 61-225582 | * 10/1986 | 165/104.26 |

* cited by examiner

HEAT PIPE COOLING SYSTEM

BACKGROUND OF INVENTION

1. Field of the Invention

The present invention relates generally to cooling systems and techniques using heat pipes.

2. Background Art

When we consider the design of a cooling system, the objective is to maintain the component(s) to be cooled at a desired temperature, usually below ambient. An implementation of a typical cooling system is shown in FIG. 1. The component(s) 10 to be cooled is generally placed in an insulated chamber or housing 12, which is kept at a temperature below ambient by an active cooling device 14. The cooling device 14 can be any conventional system known in the art, such as, for example, a thermoelectric cooler or a Stirling cooler. A Stirling engine or cooler is based on the Stirling cycle, which is a well known thermodynamic cycle. The cold side of the cooling device 14 is adjacent to the component chamber 12 to absorb the undesired heat. The heat generated in the housing 12, as well as any heat gained from the higher temperature ambient, is then transferred to the cold side of the cooling device 14 (represented by arrows in FIG. 1). The cooling device then dissipates this heat plus any heat generated in the device from the hot side to the ambient.

When we consider the active cooling system design of FIG. 1, if the heat transfer from the housing 12 contents to the cold side is through conduction only, the heat flow causes a substantial temperature rise along the length of the chamber. We now consider a case where we have the components generating heat uniformly distributed along the length of a well-insulated chamber and a cooling system maintaining one end at 100° C. with the ambient at 175° C. FIG. 2 shows the resulting temperature profile along the length of the housing 12 with the chamber constructed with a highly heat conducting material. As we can see from lower plot (B), the heat flow along the body of the component chamber increases as you approach the cooling device 14 as all of the heat that is generated to the right of any given location must flow through a given cross section. As the heat flow increases, the slope of the temperature profile increases and this results in the nonlinear temperature profile seen in upper plot (A).

The objective of the cooling system is to keep the components at a temperature well below ambient and as can be seen from FIG. 2, only a very small part of the housing 12 adjacent to the cooling device 14 will be kept within the target temperature in this design. Clearly there is a need to reduce the thermal resistance along the length of the housing 12. One method to do this is to install a heat pipe along the length of the housing. The heat pipe will absorb the heat being generated by the housed components along the length of the housing and dissipate it to the cooling device.

The use of heat pipes, also know as "heat tubes", to transfer heat is well known. Heat pipes were first suggested by R. S. Gaugler in 1942 (See U.S. Pat. No. 2,350,348) as a device to transfer heat efficiently from a hot location to a cold location. Over the years they have been used in many applications and today there are many commercial products available in the market. A more detailed description of the operation and structure of a heat pipe can be found on the World Wide Web (e.g. at http://www.thermacore.com/hpt.htm).

In the field of electronics, heat pipes have been used to transfer heat generated in electronics in a wide range of applications, including notebook PCs (See U.S. Pat. No. 6,595,269). In most of these applications the heat pipe is used as a passive device that transfers heat efficiently from a heat-generating device to an outer ambient. While most of these designs use one heat pipe to transfer the heat, a design described in U.S. Pat. No. 6,394,175 proposes the use of multiple heat pipes. In the "175 patent, the heat pipes are disposed in channels cut into a plate to which the heat dissipating electronics are mounted. The heat pipes absorb the heat from the electronics device and dissipate it at a location further away.

In other designs heat pipes are used either as passive devices to transfer the heat away or in conjunction with an active cooling device. In one design described in U.S. Pat. No. 6,052,285, a heat pipe extends from an electronic card and the condenser of the heat pipe can be inserted into a manifold that can form part of a cooling system to remove heat from the condenser. U.S. Pat. No. 6,474,074 describes an apparatus for dense chip packaging using a heat pipe in conjunction with a thermoelectric cooler and heat dissipating fins. A thermoelectric cooler, sometimes referred to as a "Peltier" cooler, is an active cooling device that transfers heat from one side to the other side when a voltage is applied to it. Another design that uses a Peltier in conjunction with heat pipes is described in U.S. Pat. No. 6,351,951. In this design, heat pipes are used to enhance the heat transfer into the cold side of the Peltier as well as to improve the heat transfer from the hot side to the ambient.

In hydrocarbon exploration and production operations, there is a need to use electronic devices at temperatures much higher than their rated operational temperature range. With oil wells being drilled deeper, the operating temperatures for these downhole instruments keeps increasing. Besides self-generated heat, conventional electronics used in the computer and communications industry generally do not have a need to operate devices at high temperatures. For this reason, most commercial electronic devices are rated only up to 85° C. (commercial rating).

Modern tools or instruments designed for subsurface operations are highly sophisticated and use electronics extensively. In order to use devices that are commercially rated in a subsurface or downhole environment, it is highly desirable to have a cooling system capable of maintaining the electronics within their operational range while disposed downhole. Conventional logging techniques include instruments for "wireline" logging, logging-while-drilling (LWD) or measurement-while-drilling (MWD), logging-while-tripping (LWT), coiled tubing, and reservoir monitoring applications. These logging techniques are well known in the art.

Heat pipes have also been implemented in downhole instruments for cooling purposes. U.S. Pat. Nos. 6,659,204, 6,378,631 and 6,216,804 describe tools for recovering subsurface core samples equipped with heat pipes. U.S. Pat. No. 4,517,459 describes a logging tool equipped with a temperature stabilization system including a heat pipe. U.S. Pat. No. 4,375,157 describes a downhole tool equipped with a thermoelectric refrigerator including a heat pipe.

There remains a need for improved cooling techniques to maintain components at a temperature below the ambient temperatures experienced in hot environments, particularly electronics housed in apparatus adapted for use where rapid temperature variations are encountered.

SUMMARY OF INVENTION

The invention provides a heat pipe cooling system. The system includes a housing; a first heat pipe disposed within the housing, the pipe having a condenser section and an evaporator section; and a plurality of secondary heat pipes, each pipe having a condenser section and an evaporator section, disposed in parallel within the housing with the evaporator sections of the secondary pipes near the condenser section of the first heat pipe; wherein the plurality of secondary heat pipes are adapted to absorb heat rejected from the condenser section of the first heat pipe for distribution from the condenser sections of the secondary heat pipes.

The invention provides a heat pipe cooling system. The system includes a housing adapted to house an electronic component and for subsurface disposal; a first heat pipe disposed within the housing, the pipe having a condenser section and an evaporator section; and a plurality of secondary heat pipes, each pipe having a condenser section and an evaporator section, disposed in parallel within the housing with the evaporator sections of the secondary pipes near the condenser section of the first heat pipe; wherein the plurality of secondary heat pipes are adapted to absorb heat rejected from the condenser section of the first heat pipe for distribution from the condenser sections of the secondary heat pipes.

The invention provides a method for transferring heat within a housing. The method includes disposing a first heat pipe within the housing, the pipe having a condenser section and an evaporator section, to absorb heat within the housing; disposing a plurality of secondary heat pipes, each pipe having a condenser section and an evaporator section, in parallel within the housing with the evaporator sections of the secondary pipes near the condenser section of the first heat pipe; adapting the plurality of secondary heat pipes to absorb heat rejected from the condenser section of the first heat pipe; and distributing the heat absorbed, by the secondary heat pipes, from the condenser sections of the secondary heat pipes toward an end of the housing.

BRIEF DESCRIPTION OF DRAWINGS

Other aspects and advantages of the invention will be apparent from the following description and the appended claims.

DETAILED DESCRIPTION

The disclosed cooling systems are based on heat pipes used to transfer heat. These cooling techniques are not limited to any particular field, they apply to any application where cooling is desired.

Figure 1:
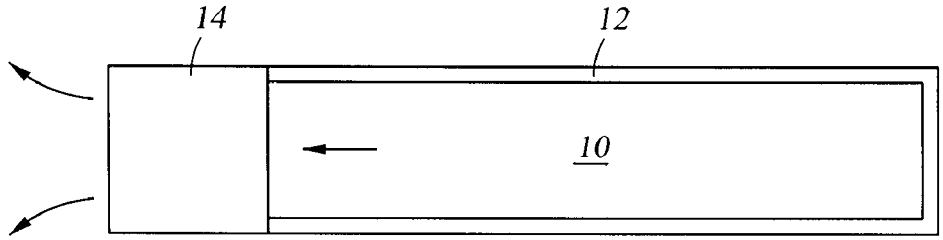
FIG. 1 is a schematic diagram of a conventional cooling system.
Figure 2A:
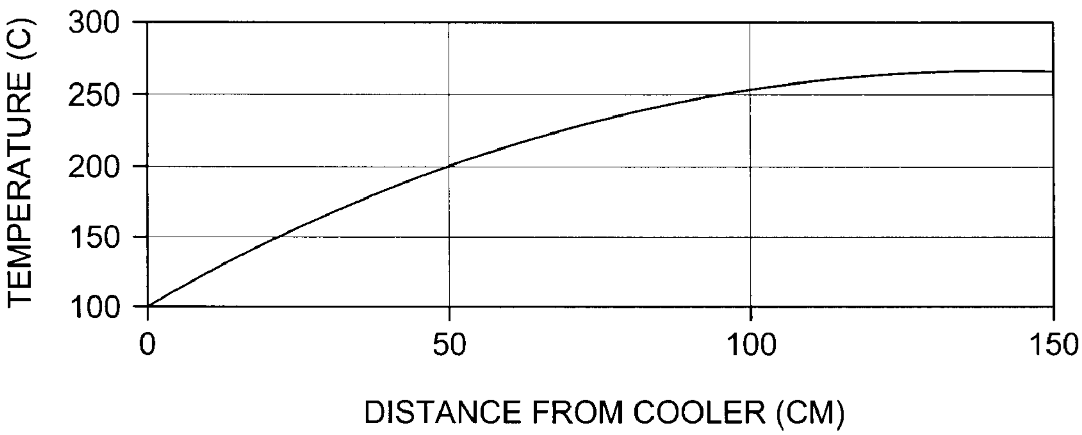
FIG. 2 shows plots of a temperature profile along the length of a housing forming part of the cooling system of FIG. 1.
Figure 2B:
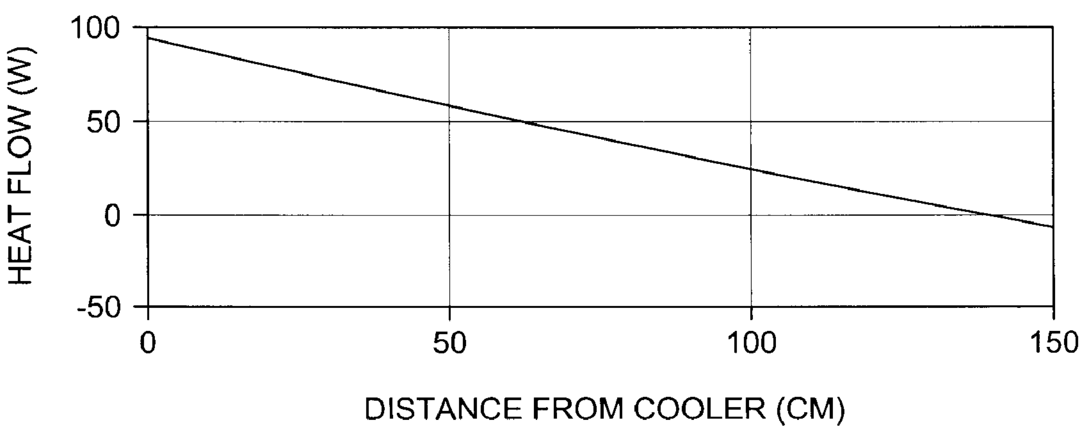
Figure 3:
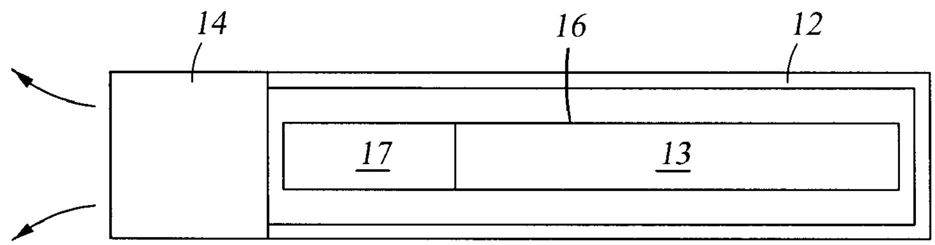
FIG. 3 is a schematic diagram of the cooling system of FIG. 1 equipped with a heat pipe.

When we consider the way a heat pipe functions, a section of the heat pipe becomes the evaporator in which the heat gets absorbed into the working fluid through evaporation. The fluid pressure becomes higher at the evaporator due to the evaporation of liquid and this causes the vapor to travel to the cooler condenser region. In the condenser, this vapor condenses giving up its latent heat of vaporization. The condensed liquid is then transferred back to the evaporator through the combined action of gravity and capillary action. If we use a heat pipe 16 to transfer the heat from a heat generating component 10 disposed within the housing, it is clear that the heat pipe should be attached along the length of the housing 12 as shown in FIG. 3.

Figure 4:
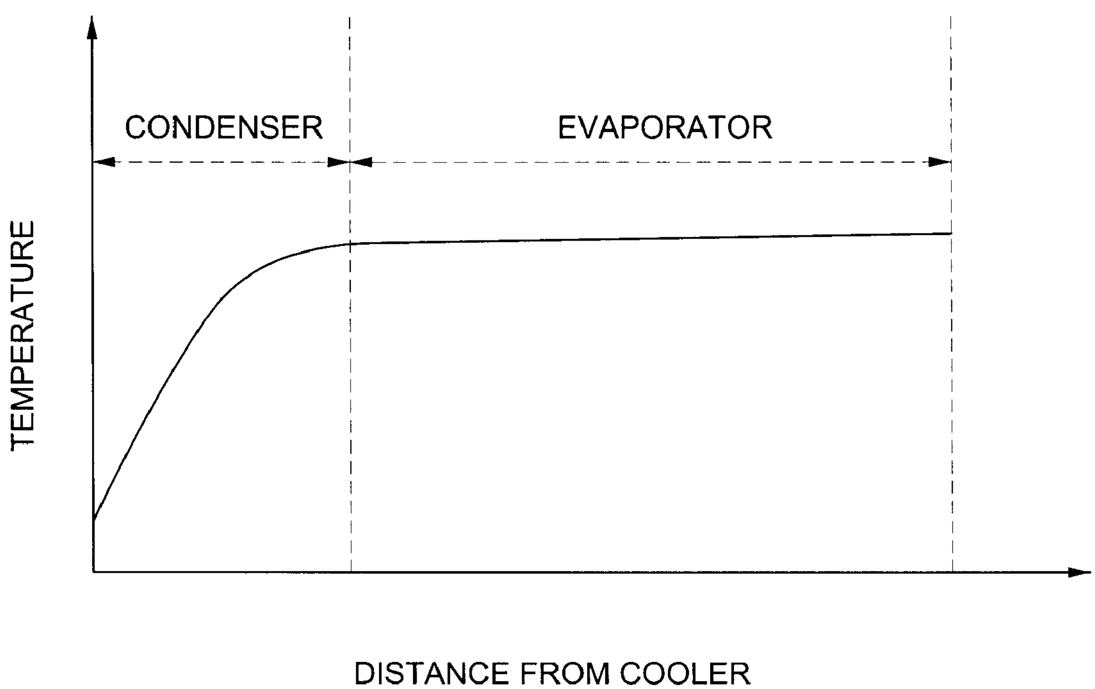
FIG. 4 shows a plot of a temperature profile along the length of the housing for the cooling system of FIG. 3.

In this case, the heat that is generated by the component will be absorbed along the evaporator section 13 of the heat pipe 16 and then dissipated along the condenser section 17. When we consider the resulting temperature profile, the temperature rise along the evaporator section would be very small, however, along the condenser section, all of the heat that is absorbed by the heat pipe gets transferred to the housing and all of this heat travels to the cold side through conduction. This would cause a high temperature gradient along this section and the resulting temperature profile will look similar to that shown in FIG. 4.

In a typical heat pipe implementation, approximately 20% of the heat pipe can be expected to become the condenser. Since the temperature rise along the condenser raises the temperature along the rest of the housing 12, it will still be difficult to meet the design objective of maintaining the component(s) at a low temperature based on this approach. The present invention discloses a design using multiple heat pipes to address this issue.

Figure 5:
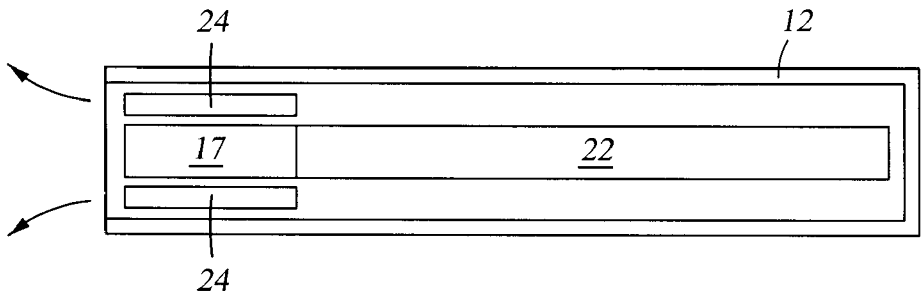
FIG. 5 is a schematic diagram of a passive heat tube cooling system in accord with the invention.

FIG. 5 shows an embodiment of the invention. A housing 12, preferably insulated, is shown with a first or primary heat pipe 22 disposed therein. Additional heat pipes 24 are positioned in parallel around the condenser section of the primary heat pipe 22 to reduce the temperature rise along this length. In this design, most of the heat that is rejected from the condenser 17 of the primary heat pipe 22 will be absorbed by the secondary set of heat pipes 24 and then dissipated out of one end of the housing 12 via any suitable means known in the art. This passive cooling embodiment may be used in applications where there is a need to transfer heat over a long distance to be dissipated to a single surface or over a small area.

Figure 6:
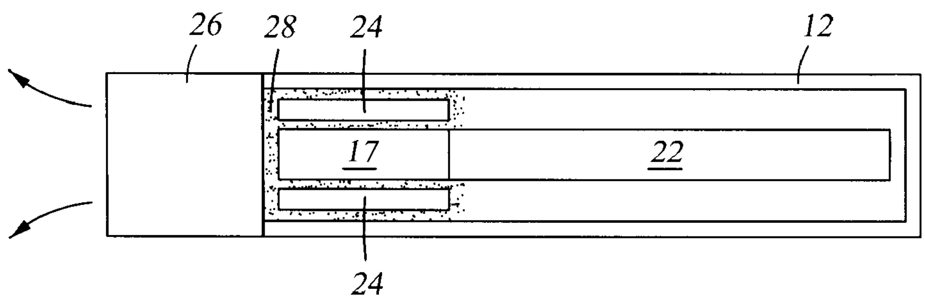
FIG. 6 is a schematic diagram of an active heat tube cooling system in accord with the invention.

FIG. 6 shows another embodiment of the invention. This heat pipe cooling system is similar to that of FIG. 5, except that a cooling device 26 is coupled to the housing 12 to receive the heat distributed from the condenser sections of the secondary heat pipes 24. Any conventional heat transfer mechanism may be used for the cooling device 26 as known in the art (e.g., a thermoelectric cooler, a Stirling-cycle cooling systems, vapor-compression-cycle cooling systems, heat sinks). With the embodiment of FIG. 6, most of the heat that is rejected from the condenser of the primary heat pipe 22 will be absorbed by the secondary set of heat pipes 24 and then dispensed much closer to the cold side of the cooling device 26. Since the secondary heat pipes 24 also work the same way, they will also have condenser sections, which will reject the heat. These sections may be much shorter than the condenser of the primary heat pipe 22. For example, for a housing 12 that is three to four feet [0.91 to 1.2 meters] long, the condenser of the primary heat pipe 22 can be around twelve inches [0.3 meters] while the secondary heat pipes 24 can have a three-inch [7.6 cm] condenser section.

Figure 7:
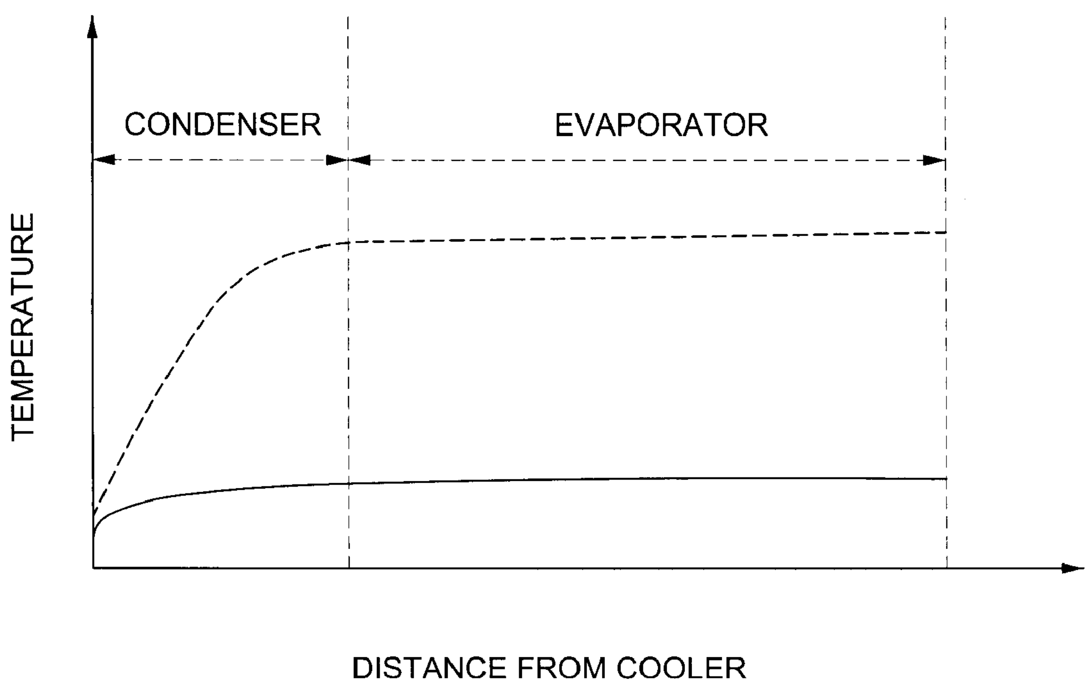
FIG. 7 shows a plot comparing temperature profiles along the length of a housing for the cooling system of FIG. 3 (dashed) and for a cooling system embodiment of the invention (solid).

Since we have the same amount of heat coming out of the condensers of the secondary heat pipes 24, we will have the same or slightly higher slope in the temperature distribution along these shorter condenser sections. However, since the high slope is only over a short length, the resulting temperature rise is much smaller and therefore, the temperature of the housing 12 will be much lower in this case. FIG. 7 shows a likely temperature distribution for the case with one heat pipe (dashed) and a configuration with multiple heat pipes according to the present invention (solid). As can be seen, the temperature of the housing 12 would be much lower in the design of the present invention.

Embodiments of the invention, as well as other passive solutions using heat pipes, depend on conduction to transfer the heat from the heat pipe condenser to the cold side, and therefore, it is desirable to use a highly thermally conductive material 28 to interface the heat pipes to the cold side of the cooling device 26. It is also preferable to minimize the thermal contact resistance between the heat pipes 22, 24, the housing 12, and the cold side of the cooling device 26. This can be achieved by using the thermally conductive material 28 to fill in these gaps and by configuring the structure to apply appropriate pressure.

Figure 8:
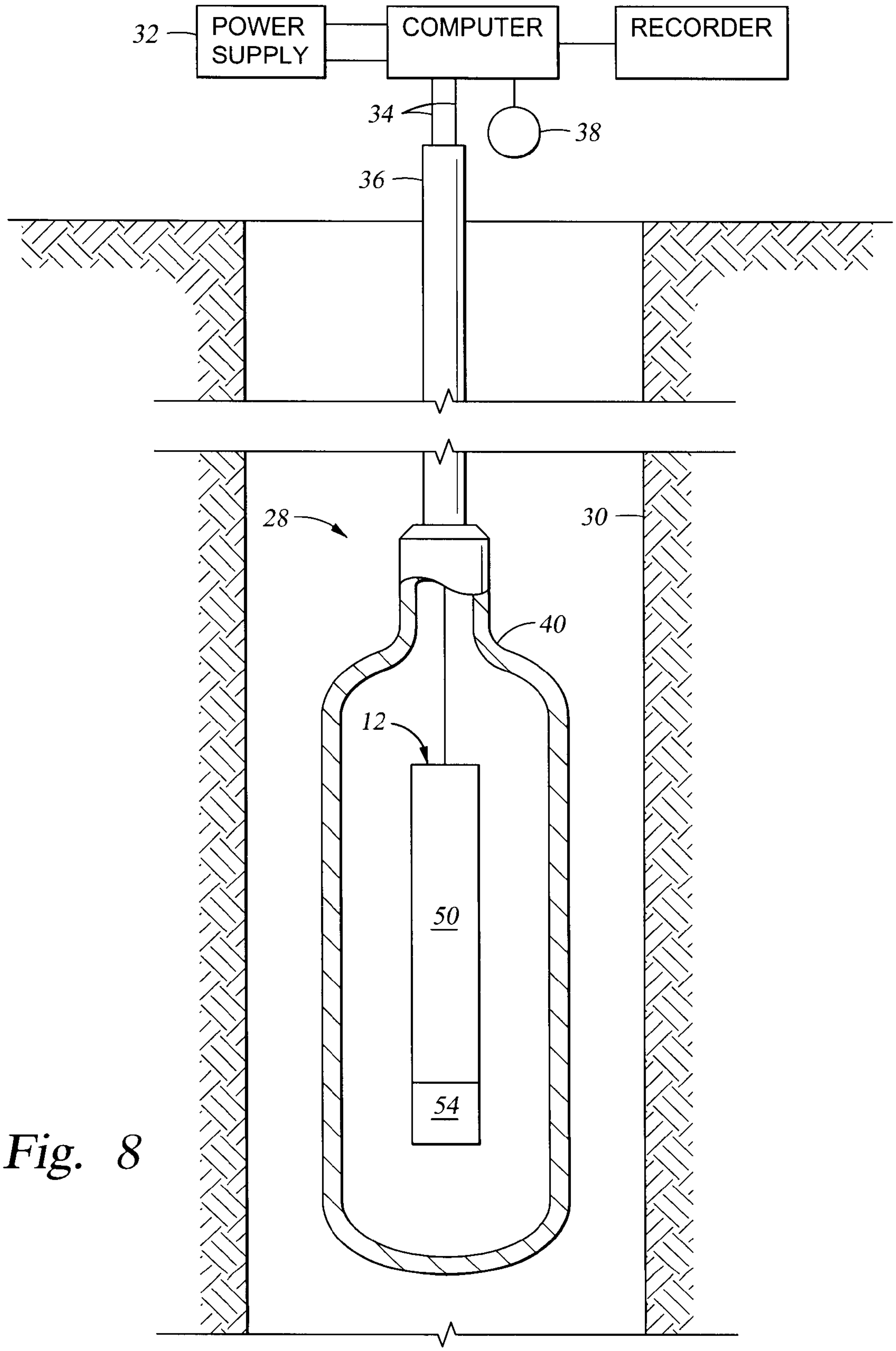
FIG. 8 shows a downhole instrument disposed in a borehole and equipped with a heat pipe cooling system in accord with the invention.

FIG. 8 shows an instrument designed for subsurface logging operations including a heat pipe cooling system 50 of the invention. The downhole tool 28 is disposed in a borehole 30 that penetrates an earth formation. The cooling system 50 includes an insulated housing 12 adapted to house the component (e.g. electronics) to be cooled. In some embodiments, the housing 12 may consist of a Dewar flask. FIG. 8 shows an embodiment with the tool 28 including a cooling device 54 coupled to the housing 12 to receive the heat distributed from the heat pipe condensers as described herein. The tool housing 40 may be any type of conventional shell, such as a metallic, nonmetallic, or composite sleeve as known in the art. The tool 28 is shown supported in the borehole 30 by a multi-wire cable 36 in the case of a wireline system or a drill string 36 in the case of a while-drilling system.

With a wireline tool, the tool 28 is raised and lowered in the borehole 30 by a winch 38, which is controlled by the surface equipment 32. Logging cable or drill string 36 includes conductors 34 that connect the tool's electronics with the surface equipment 32 for signal and control communication. Alternatively, these signals may be processed or recorded in the tool 28 and the processed data transmitted to the surface equipment 32. FIG. 8 exemplifies a typical logging tool configuration implemented with a heat pipe cooling system of the invention. It will be appreciated by those skilled in the art that other types of downhole instruments and systems may be used to implement the invention.

For clarity of illustration, the heat pipe cooling systems of the invention are shown schematically. Conventional components, connectors, valves and mounting hardware may be used to implement the cooling systems as known in the art. It will also be appreciated by those skilled in the art that the actual physical layout of the systems may be varied without departing from the scope of the invention depending on the space constraints of the particular implementation.

As known in the art, downhole tools used for while-drilling applications are typically powered by turbines that are operated via the borehole fluid ("mud") flowing through the tool. These tools generally have a battery power backup to keep the tools operational when mudflow is stopped periodically for various reasons. If implemented in a while-drilling downhole tool 28, a heat pipe cooling system of the invention may be equipped with a cooling device 26 operable either directly via the mud turbine or by having it powered electrically as known in the art (not shown). In applications where exposure to high temperatures is only for a limited period of time, cooling is similarly required for a brief period of time. A passive heat pipe cooling system of the invention is suitable for such applications. A passively operated system is particularly useful in applications where power is not supplied or interrupted.

When implemented in downhole tools for subsurface disposal, the cooling systems of the invention provide several benefits. Minimal moving parts in the cooling system (heat pipe itself has no moving parts) provide a major advantage in qualifying the instruments for shock and vibration. The lack of hazardous working fluids minimizes environmental and other concerns with using the systems in the downhole environment.

Figure 9:
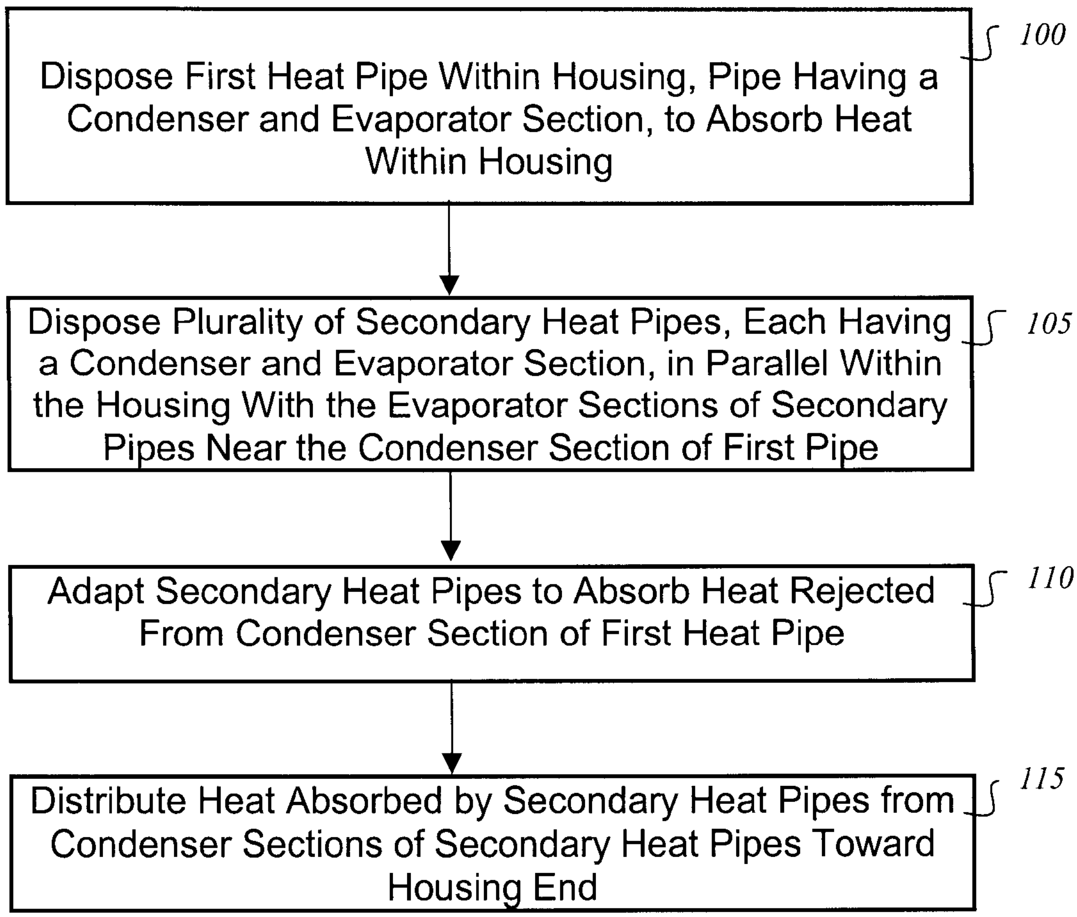
FIG. 9 illustrates a flow chart of a process for transferring heat within a housing in accord with the invention.

FIG. 9 shows a flow chart illustrating a process for transferring heat within a housing according to the invention. At step 100, the process begins by disposing a first heat pipe within the housing, the pipe having a condenser section and an evaporator section, to absorb heat within the housing. A plurality of secondary heat pipes are then disposed within the housing in parallel, each pipe having a condenser section and an evaporator section, with the evaporator sections of the secondary pipes near the condenser section of the first heat pipe (at step 105). The plurality of secondary heat pipes are then adapted to absorb heat rejected from the condenser section of the first heat pipe (at step 110). At step 115, the heat absorbed by the secondary heat pipes is distributed from the condenser sections of the secondary heat pipes toward an end of the housing.

What is claimed is:

1. A heat pipe cooling system, comprising:

a housing adapted for subsurface disposal;

a first heat pipe disposed within the housing, the pipe having a condenser section and an evaporator section; and a plurality of secondary heat pipes, each pipe having a condenser section and an evaporator section, disposed within the housing with the evaporator and condenser sections of the secondary pipes substantially in parallel with the condenser section of the first heat pipe;

wherein the plurality of secondary heat pipes are adapted to absorb heat rejected from the condenser section of the first heat pipe for distribution from the condenser sections of the secondary heat pipes.

2. The system of claim 1, wherein the plurality of secondary heat pipes surround the first heat pipe.

3. The system of claim 2, further comprising a cooling device coupled to the housing and adapted to receive heat distributed from the condenser sections of the secondary heat pipes.

4. The system of claim 3, wherein the housing is adapted to house an electronic component.

5. The system of claim 4, wherein the housing is insulated to restrict heat passage across its walls.

6. The system of claim 5, wherein the secondary heat pipes are in contact with a thermally conductive material disposed within the housing.

7. The system of claim 1, further comprising a cooling device coupled to the housing and adapted to receive heat distributed from the condenser sections of the secondary heat pipes.

8. The system of claim 7, wherein the housing comprises a thermally conductive material interfacing the secondary heat pipes and the cooling device.

9. The system of claim 7, wherein the cooling device comprises one of a Stirling-cycle, thermoelectric, or vapor-compression-cycle mechanism.

10. The system of claim 1, wherein the housing comprises a dewar flask.

11. The method of claim 1, wherein the housing is insulated to restrict heat passage across its walls.

12. The method of claim 1, wherein the housing is adapted to house an electronic component.

13. The method of claim 1, wherein the housing comprises a dewar flask.

14. A heat pipe cooling system, comprising:

a housing adapted to house an electronic component and for subsurface disposal;

a first heat pipe disposed within the housing, the pipe having a condenser section and an evaporator section; and a plurality of secondary heat pipes, each pipe having a condenser section and an evaporator section, disposed within the housing with the evaporator and condenser sections of the secondary pipes substantially in parallel with the condenser section of the first heat pipe;

wherein the plurality of secondary heat pipes are adapted to absorb heat rejected from the condenser section of the first heat pipe for distribution from the condenser sections of the secondary heat pipes.

15. The system of claim 14, further comprising a cooling device coupled to the housing and adapted to receive heat distributed from the condenser sections of the secondary heat pipes.

16. The system of claim 15, wherein the housing is insulated to restrict heat passage across its walls.

17. The system of claim 16, wherein the housing comprises a thermally conductive material interfacing the secondary heat pipes and the cooling device.

18. The system of claim 15, wherein the cooling device comprises one of a Stirling-cycle, thermoelectric, or vapor-compression-cycle mechanism.

19. The system of claim 14, wherein the housing comprises a dewar flask.

20. A method for transferring heat within a housing, comprising:

a) disposing a first heat pipe within a housing adapted for subsurface disposal, the pipe having a condenser section and an evaporator section, to absorb heat within the housing;

b) disposing a plurality of secondary heat pipes, each pipe having a condenser section and an evaporator section, within the housing with the evaporator and condenser sections of the secondary pipes substantially in parallel with the condenser section of the first heat pipe;

c) adapting the plurality of secondary heat pipes to absorb heat rejected from the condenser section of the first heat pipe; and d) distributing the heat absorbed, by the secondary heat pipes, from the condenser sections of the secondary heat pipes toward an end of the housing.

21. The method of claim 20, further comprising coupling a cooling device to the housing to expel from the housing the heat distributed from the condenser sections of the secondary heat pipes.

22. The method of claim 21, further comprising disposing a thermally conductive material within the housing to interface the secondary heat pipes and the cooling device.

23. The method of claim 21, wherein the cooling device comprises one of a Stirling-cycle, thermoelectric, or vapor-compression-cycle mechanism.

* * * * *